United States Patent
Meher et al.

(10) Patent No.: US 12,445,145 B2
(45) Date of Patent: Oct. 14, 2025

(54) VOLTAGE REGULATOR FOR SWITCH CONTROL

(71) Applicant: Texas Instruments Incorporated, Dallas, TX (US)

(72) Inventors: Deepak Kumar Meher, Bangalore (IN); Gautam Salil Nandi, Bangalore (IN); Tanmay Neema, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 235 days.

(21) Appl. No.: 18/459,102

(22) Filed: Aug. 31, 2023

(65) Prior Publication Data
US 2025/0080132 A1 Mar. 6, 2025

(30) Foreign Application Priority Data
Mar. 1, 2023 (IN) .............................. 202341013734

(51) Int. Cl.
*H03M 1/78* (2006.01)
*H02M 1/08* (2006.01)
*H03M 1/00* (2006.01)
*H03M 1/06* (2006.01)
*H03M 1/74* (2006.01)

(52) U.S. Cl.
CPC ............. *H03M 1/785* (2013.01); *H02M 1/08* (2013.01); *H03M 1/00* (2013.01); *H03M 1/06* (2013.01); *H03M 1/747* (2013.01)

(58) Field of Classification Search
CPC .......... H03M 1/78; H03M 1/00; H03M 1/747; H03M 1/06; H02M 1/08
See application file for complete search history.

(56) References Cited

U.S. PATENT DOCUMENTS

| 4,942,397 A | * | 7/1990 | Real .................... H03M 1/1057 341/118 |
| 5,075,677 A | | 12/1991 | Meaney et al. |
| 8,537,043 B1 | | 9/2013 | McLachlan et al. |

OTHER PUBLICATIONS

International Search Report in corresponding PCT Application No. PCT/US2024/016983, mailed Jul. 2, 2024.

\* cited by examiner

*Primary Examiner* — Joseph J Lauture
(74) *Attorney, Agent, or Firm* — Mandy Barsilai Fernandez; Frank D. Cimino

(57) ABSTRACT

In described examples, an R2R digital-to-analog converter includes multiple arms and a voltage regulator. Respective arms include an arm switch with a p-channel MOSFET (PFET) switch and an n-channel MOSFET (NFET) switch. The voltage regulator includes a differential amplifier, a p-ladder that includes N cascade-coupled PFETS and has first and second ends, an n-ladder that includes y×N cascade-coupled NFETS and has first and second ends, a first resistor (resistance R), and a second resistor (resistance y×R). The first p-ladder end is coupled to a first terminal of the first resistor. The second terminal of the first resistor is coupled to an input of the differential amplifier and a first terminal of the second resistor. A second terminal of the second resistor is coupled to the first n-ladder end. An output of the differential amplifier is coupled to the second n-ladder end and provides a gate voltage of the NFET switch.

20 Claims, 8 Drawing Sheets

VOLTAGE REGULATOR FOR SWITCH CONTROL

TECHNICAL FIELD

This application relates generally to voltage regulation, and more particularly to regulating a voltage of a switch control terminal.

BACKGROUND

A digital-to-analog converter ("DAC") is a device that receives a digital input value, or code, and provides an analog output voltage proportional to or representative of the value of the digital input. The digital input value may follow, for example, standard binary representation. There are various DAC architectures currently used in available devices. Selection of a particular architecture may depend on the application and performance and design metrics, such as power consumption, speed, glitch magnitude and energy, the area required to implement the device, and so forth. An R2R or R-2R resistor ladder is an example structure used to implement high bit-precision DACs.

SUMMARY

In described examples, an R2R digital-to-analog converter includes multiple arms and a voltage regulator. Respective arms include an arm switch with a p-channel MOSFET (PFET) switch and an n-channel MOSFET (NFET) switch. The voltage regulator includes a differential amplifier, a p-ladder that includes N cascade-connected PFETS and has first and second ends, an n-ladder that includes y×N cascade-coupled NFETS and has first and second ends, a first resistor (resistance R), and a second resistor (resistance y×R). The first p-ladder end is coupled to a first terminal of the first resistor. The second terminal of the first resistor is coupled to an input of the differential amplifier and a first terminal of the second resistor. A second terminal of the second resistor is coupled to the first n-ladder end. An output of the differential amplifier is coupled to the second n-ladder end and provides a gate voltage of the NFET switch.

DETAILED DESCRIPTION

In some examples, differences between intended DAC output for a code and actual DAC output for a code are categorized as differential nonlinearity (DNL) or integral nonlinearity (INL). An ideal output voltage step should correspond to a least significant bit change in the code. DNL error is the difference between the magnitude of the ideal output voltage step between successive codes and the magnitude of the measured voltage step between successive codes. INL error is the difference between the ideal output voltage for a particular code and the measured output voltage for the code.

In an R2R resistor ladder, a difference in on resistance ($R_{ON}$) between a high-side switch and a low-side switch that connect a ladder arm to high and low voltage rails or terminals (respectively) can cause non-linearity. In some examples, an on voltage at a switch control terminal is regulated to regulate an on resistance of the switch. Metal-oxide-semiconductor field-effect transistors (MOSFETS) can be used to implement such switches. Using a high-side p-channel MOSFET (PFET) and a low-side n-channel MOSFET (NFET) for switches used to pass high side and low side voltage references to ladder arms facilitates matching $R_{ON}$ values to reduce non-linearity. Larger high-side and low-side switch size enables easier matching of high-side and low-side switch on resistances. A voltage regulator that regulates the gate voltages of the PFET and NFET switches can also be used to better match high-side and low-side switch on resistances, and accordingly, to enable use of smaller high-side and low-side switches.

In some examples, an R2R resistor ladder includes thermometric arms (also called thermometer arms) and binary arms. Activating successive thermometer arms contributes equal voltages to the DAC output. Binary arms are referred to as having most significant bit (MSB) arms and least significant bit (LSB) arms. Activating successive binary arms from MSB arms to LSB arms (successively lower weightage arms) contributes a voltage, then one half of the voltage, then one quarter of the voltage, and so on.

Accordingly, $R_{ON}$ values are doubled in switches connecting successive binary arms to respective voltage references. $R_{ON}$ values are doubled by reducing switch size by half in successive binary arms. In some examples, in high resolution DACs (DACs with resolution of a relatively large number of bits, such as eighteen bits), minimum switch size allowed by the manufacturing process is reached before the lowest weightage arm. In some examples, an offset resistance added to a series resistance of the R2R ladder can be used to reduce a maximum magnitude of DNL caused by not scaling one or more LSB arms.

Figure 1:
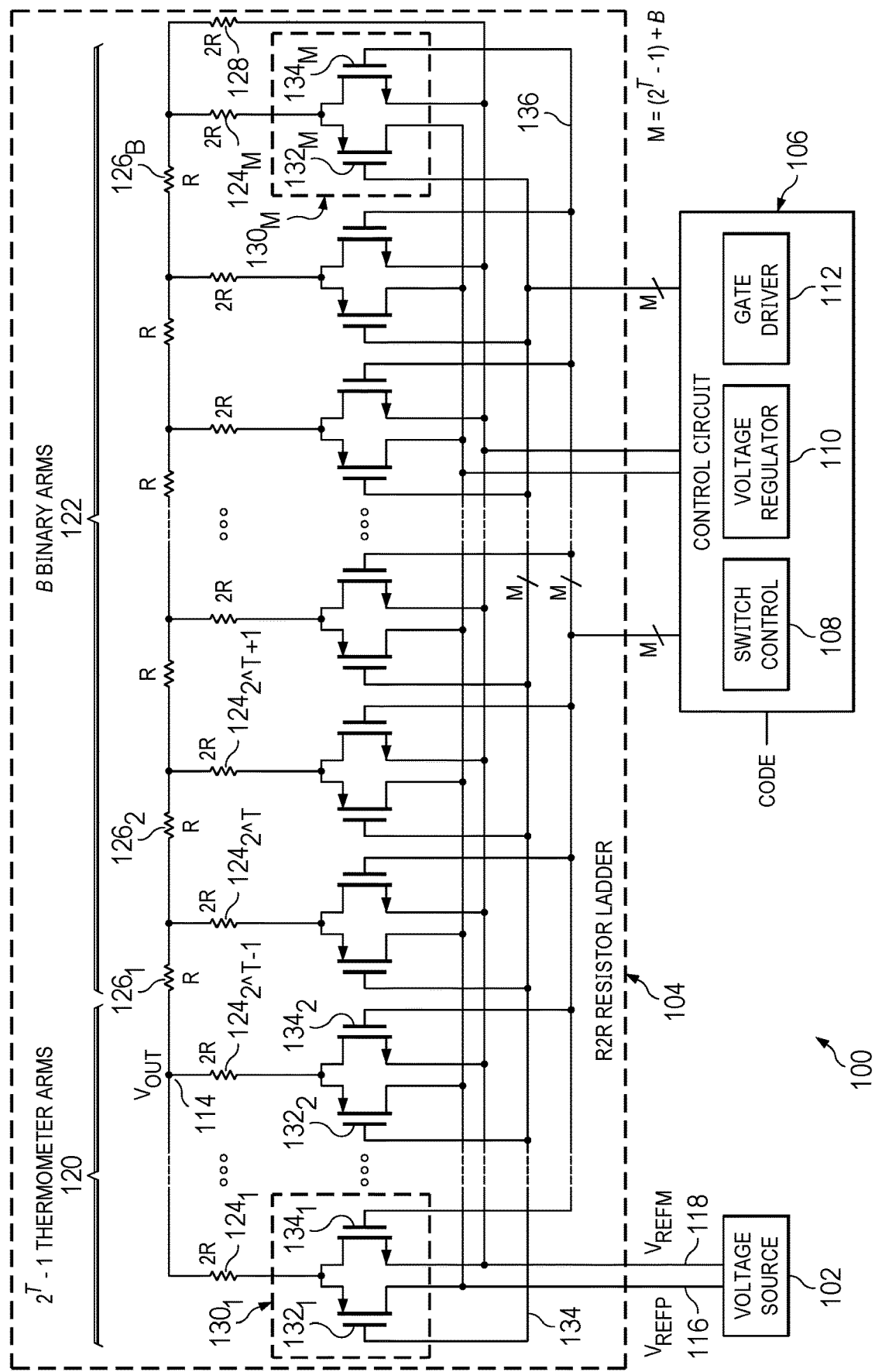
FIG. 1 is a functional block and circuit diagram of an example R2R DAC.

FIG. 1 is a functional block and circuit diagram of an example R2R DAC 100. The R2R DAC 100 is an N-bit precision DAC. The R2R DAC 100 includes a voltage source 102, an R2R resistor ladder 104, and a control circuit 106. The control circuit 106 includes a switch control 108, a voltage regulator 110, and a gate driver 112. The voltage source 102 includes a first output providing a relatively high voltage reference $V_{REFP}$ to a high voltage rail or terminal 116 of the R2R resistor ladder 104, and a second output providing a relatively low voltage reference $V_{REFM}$ to a low voltage rail or terminal 118 of the R2R resistor ladder 104. In some examples, some or all components of the resistor ladder 104 and/or the control circuit 106 are included within a single integrated circuit (IC).

In some examples, the voltage source 102 generates $V_{REFP}$ using an off-chip reference generator, such as a bandgap reference. The resulting voltage is buffered inside the chip using a reference buffer before the voltage source 102 provides the voltage to the high voltage rail 116. Alternatively, the voltage source 102 generates $V_{REFP}$ using an on-chip reference generator, buffers the resulting voltage using a reference buffer, and provides the buffered voltage to the high voltage rail 116. In some examples, the voltage source 102 generates $V_{REFM}$ using a ground buffer inside the chip, and provides the resulting voltage to the low voltage rail 118. An input of the ground buffer is connected to a REFGND pin. The REFGND pin is connected to a REFGRND plane on a printed circuit board (PCB). Alternatively, the low voltage rail 118 is directly connected to the REFGND pin. In some examples, a high voltage rail 116 voltage is five volts and a low voltage rail 118 voltage is zero volts.

The R2R DAC 100 has a total of N bits of precision, and has two types of structures, referred to as arms. A first set of (thermometer) arms coarsely resolves the more significant of the N bits, and a second set of (binary) arms refines the less significant of the N bits. Relatedly, these arms have inputs that receive signals from the control circuit 106. The R2R resistor ladder 104 has an output voltage terminal 114 with voltage $V_{OUT}$. The R2R resistor ladder 104 includes $2^T-1$ thermometer arms 120 and B binary arms 122, where T and B are integers and T+B=N. In its entirety, the R2R resistor ladder 104 includes $2^T-1+B$ arms. Accordingly, the R2R resistor ladder 104 has a number of arms M, equal to the number of thermometer arms 120 plus the number of binary arms 122, as follows: $M=2^T-1+B$.

Activating thermometer arms 120 or binary arms 122 refers to coupling the output voltage terminal 114 to the high voltage rail 116 via the activated thermometer or binary arms 120 or 122. Deactivating thermometer arms 120 or binary arms 122 refers to coupling the output voltage terminal 114 to the low voltage rail 118 via the deactivated thermometer or binary arms 120 or 122. The R2R resistor ladder 104 also includes a terminating resistor 128 with resistance 2R, and M arm switches 130 that selectably connect the thermometer arms 120 and binary arms 122 to the high voltage rail 116 or the low voltage rail 118.

The control circuit 106 includes a code input to receive a code, such as a digital code. The control circuit 106 also includes a first set of M outputs coupled to a first set of M inputs of the R2R resistor ladder 104 to control low-side switches of all of the arms of the R2R resistor ladder 104. The control circuit 106 further includes a second set of M outputs coupled to a second set of M inputs of the R2R resistor ladder 104 to control high-side switches of all of the arms of the R2R resistor ladder 104. In some examples, the first and second sets of outputs of the control circuit 106 are respective buses that are each M control lines wide.

The code is a DAC 100 control input signal, and is used to determine R2R resistor ladder 104 control signals. The R2R resistor ladder 104 control signals are used to activate and deactivate thermometer arms 120 and binary arms 122. Accordingly, in response to the code, the switch control 108 determines a combination of thermometric and binary arms 120 and 122 to couple to the high voltage rail 116 or the low voltage rail 118, responsive to which the R2R resistor ladder 104 provides at $V_{OUT}$ 114 a voltage representative of the code. The switch control 108 provides control signals to the gate driver 112 to drive PFET or NFET switches 132 or 134 to couple the thermometric and binary arms 120 and 122 to the high voltage rail 116 or the low voltage rail 118, respectively. The voltage regulator 110 is used to set a voltage used by the gate driver 112 to drive the NFET switches 134. In some examples, the switch control 108, voltage regulator 110, or gate driver 112, is implemented as a digital circuit, an analog circuit, or a mixed digital/analog circuit.

For purposes of explanation, an ideal DAC 100 output voltage response to input code is assumed. In some examples, in response to non-ideal behavior of the DAC 100, thermometer arms 120 and binary arms 122 activated or deactivated by the R2R resistor ladder 104 control signals are different from thermometer arms 120 and binary arms 122 corresponding to the code. Ideally, for an N bit code corresponding to an N bit resolution DAC 100, the T most significant bits correspond to the thermometer arms 120, and the B least significant bits correspond to the binary arms 122. Individual thermometer arms 120 correspond to a code value of $2^B$ and a number $j^{th}$ binary arm 122 corresponds to a code value of $2^{B-j}$, where a first binary arm 122 is an MSB binary arm 122 and a $B^{th}$ binary arm 122 is an LSB binary arm 122.

Thermometer arms 120 include an arm resistor 124 with resistance 2R. Individual ones of the arm resistors 124 of the thermometer arms 120 are numbered with a subscript (from 1 to $2^T-1$) depending on ordinal position of the respective thermometer arms 120 within the set of thermometer arms 120. Accordingly, the arm resistors 124 of the thermometer arms 120 are subscript numbered in an order in which the thermometer arms 120 are activated as the code increases. For example, a first arm resistor is $124_1$, a second is $124_2$, and a $(2^T-1)^{th}$ (last arm resistor 124 of the thermometer arms 120) is $124_{2^{\wedge}T-1}$. First terminals of the arm resistors 124 of the thermometer arms 120 are connected to the output voltage terminal 114.

Binary arms 122 include an arm resistor 124 with resistance 2R and a connector resistor 126 with resistance R. Recall that $M=2T-1+B$. Individual ones of the arm resistors 124 of the binary arms 122 are numbered with a subscript (from $2^T$ to M) from an MSB binary arm 122 to an LSB binary arm 122. Individual ones of the connector resistors 126 of the binary arms 122 are numbered with a subscript (from 1 to B) from the MSB binary arm 122 to the LSB binary arm 122. For example, a most significant bit (first) arm resistor $124_{2^{\wedge}T}$ and connector resistor $126_1$, a next most significant bit (second) arm resistor $124_{2^{\wedge}T}$ and connector resistor $126_2$, and a least significant bit ($B^{th}$) arm resistor $124_M$ and connector resistor $126_B$.

Connector resistors 126 of the binary arms 122 are connected in series between the voltage output terminal 114 and a first terminal of the terminating resistor 128. More particularly, a first terminal of the first connector resistor $126_1$ is connected to the voltage output terminal 114. A second terminal of the first connector resistor $126_1$ is connected to a first terminal of the second connector resistor $126_2$, and so on. Finally, a second terminal of the $B^{th}$ connector resistor $126_B$ is connected to a first terminal of the terminating resistor 128. A second terminal of the terminating resistor 128 is connected to the low voltage rail 118.

Arm switches 130 include a PFET switch 132 (high-side switch) and an NFET switch 134 (low-side switch). Arm switches 130, and corresponding PFET switch 132 and NFET switch 134, are numbered with a subscript that is the same as the subscript of the corresponding connected arm resistor 124. A first terminal of a $j^{th}$ arm resistor $124_j$ of the thermometer arms 122 ($1 \le j \le 2^T-1$) is connected to the output voltage terminal 114. A second terminal of the $j^{th}$ arm resistor $124_j$ of the thermometer arms 122 is connected to a source of the $j^{th}$ PFET switch $132_j$ and a drain of the $j^{th}$ NFET switch $134_j$. A first terminal of a $j^{th}$ arm resistor $124_{2^{\wedge}T-1+j}$ of the binary arms 122 ($1 \leq j \leq B-1$) is connected between a $j^{th}$ connector resistor $126_j$ and a $j+1^{th}$ connector resistor $126_{j+1}$. A first terminal of the $B^{th}$ arm resistor $124_B$ of the binary arms 122 is connected between the $B^{th}$ connector resistor $126_B$ and the terminating resistor 128. A second terminal of the $j^{th}$ arm resistor $124_{2^{\wedge}T-1+j}$ of the binary arms 122 is connected to a source of the $(2^T-1+j)^{th}$ PFET switch $132_{2^{\wedge}T-1+j}$ and a drain of the $(2^T-1+j)^{th}$ NFET switch $134_{2^{\wedge}T-1+j}$.

A drain of the $j^{th}$ PFET switch $132_j$ ($1 \leq j \leq M$) is connected to the high voltage rail 116, and a source of the $j^{th}$ NFET switch $134_j$ is connected to the low voltage rail 118. A gate of the $j^{th}$ PFET switch $132_j$ is connected to a corresponding one of M high-side control lines 134. A drain of the $j^{th}$ NFET switch $134_j$ is connected to a corresponding one of M low-side control lines 136.

A thermometer arm 120 or binary arm 122 can be coupled to $V_{REFP}$ by turning on its corresponding PFET switch 132 and turning off its corresponding NFET switch 134. A thermometer arm 120 or binary arm 122 can be coupled to $V_{REFM}$ by turning off its corresponding PFET switch 132 and turning on its corresponding NFET switch 134. Selective activation or deactivation of a thermometer arm 120 provides the relatively coarse selection of analog output voltage $V_{OUT}$ in response to the code. Selective activation or deactivation of a binary arm 122 provides the relatively fine selection of analog output voltage $V_{OUT}$ in response to the code. Activation of h thermometer arms 120 contributes a voltage to $V_{OUT}$ as given by Equation 1:

$$\text{Thermometer Arms } V_{OUT} = (V_{REFP} - V_{REFM}) \times \frac{h \times 2^B}{2^N} + V_{REFM} \quad \text{Equation 1}$$

Activation of up to B of the $j^{th}$ binary arms 122 specified by a code contributes a voltage to $V_{OUT}$ as given by Equation 2:

$$\text{Binary Arms } V_{OUT} = (V_{REFP} - V_{REFM}) \times \sum_{code} \frac{2^{B-j}}{2^N} + V_{REFM} \quad \text{Equation 2}$$

Activation and deactivation of the thermometer arms 120 and the binary arms 122 is controlled by the switch control 108 in response to the code received by the control circuit 106.

Figure 2:
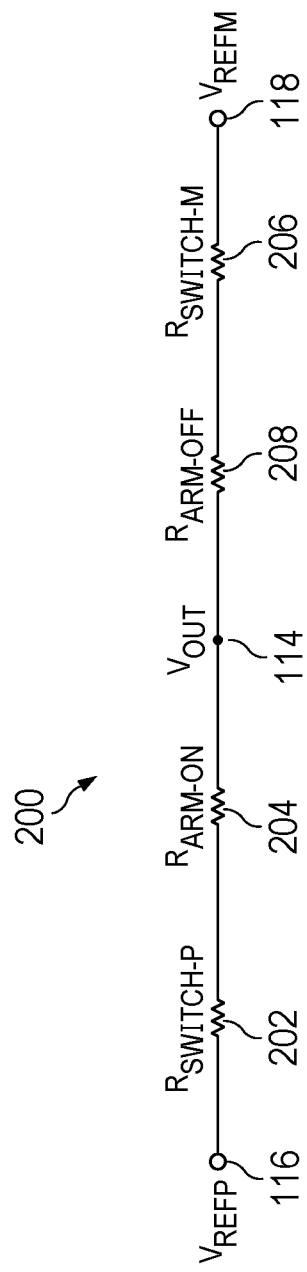
FIG. 2 is a functional block and circuit diagram of an example model of the R2R DAC.

FIG. 2 is a functional block and circuit diagram of an example resistance and voltage model 200 of the thermometer arms 120 and binary arms 122 of the R2R DAC 100 of FIG. 1 at a mid-code. The same reference numbers or other reference designators are used in the drawings to designate the same or similar (structurally and/or functionally) features.

The model 200 is used to describe how differences between $R_{ON}$ of PFET switches 132 and $R_{ON}$ of NFET switches 134 in thermometer arms 120 and binary arms 122 can contribute nonlinearities to $V_{OUT}$ of the R2R DAC 100. A middle code, or "mid-code," is halfway between a first value of the code (zero code) and a last value of the code (full code). In some examples, a first value of the code is zero, or 000 . . . 000 (N zeroes), a last value of the code is $2^N-1$, or 111 . . . 111 (N ones), and a mid-code is $2^{N-1}-1$, or 011 . . . 111 (a zero followed by N−1 ones). At the mid-code, half rounded down ($2^{T-1}-1$) of the thermometer arms 120 are activated, and half rounded up ($2^{T-1}$) of the thermometer arms 120 are deactivated. Also, all of the binary arms 122 are activated, providing a voltage equal to one more active thermometer arm 120 (minus one LSB, which can be ignored with respect to a high-precision R2R DAC 100 for purposes of this model).

The model 200 includes an equivalent on resistance ($R_{ON}$) $R_{SWITCH-P}$ 202 (connecting to $V_{REFP}$) of the PFET switches 132 that are turned on to activate the activated thermometer arms 120 and binary arms 122, an equivalent resistance $R_{ARM-ON}$ 204 of the activated thermometer arms 120 and binary arms 122, an equivalent $R_{ON}$ $R_{SWITCH-M}$ 206 (connecting to $V_{REFM}$) of the NFET switches 134 that are turned on to deactivate the deactivated thermometer arms 120, and an equivalent resistance $R_{ARM-OFF}$ 204 of the deactivated thermometer arms 120. A resistance of $2^{T-1}-1$ turned-on thermometer arm 120 and B binary arm 122 PFET switches 132 in parallel, corresponding to $R_{SWITCH-P}$ 202, is $R_{ON}$ (PFET)$/2^{T-1}$. A resistance of $2^{T-1}$ turned-on NFET switches 134 in parallel, corresponding to $R_{SWITCH-M}$ 206, is $R_{ON}$ (NFET)$/2^{T-1}$. A looking-in resistance of $2^{T-1}-1$ thermometer arm resistors 124 and of the various resistors of the B binary arms 122 corresponds to $R_{ARM-ON}$ 204. A resistance of $2^{T-1}$ thermometer arm resistors 124 in parallel corresponds to $R_{TH-OFF}$ 208. $R_{ARM-ON}$ 204 and $R_{TH-OFF}$ 208 equal $2R/2^{T-1}$.

$V_{OUT}$ is correct at zero code, because all thermometer arms 120 and binary arms 122 are deactivated, so that $V_{OUT}$ equals zero (or $V_{REFM}$). $V_{OUT}$ is also correct at full code, because all thermometer arms 120 and binary arms 122 are activated, so that $V_{OUT}$ equals $V_{REFP} \times (2^N-1)/2^N$ (very close to $V_{REFP}$). As illustrated by the model 200, at mid-code the resistance from the high voltage rail 116 to $V_{OUT}$ 114 via the activated thermometer arms 120 and binary arms 122 should be the same as the voltage from the low voltage rail 118 to $V_{OUT}$ 114 via the deactivated thermometer arms 120. If at mid-code these resistances are equal, then the thermometer arms 120 and binary arms 122 together contribute to $V_{OUT}$ half of the voltage that the thermometer and binary arms 120 and 122 can contribute (see Equations 1 and 2). If at mid-code these resistances are different, then there is an INL error.

Figure 3:
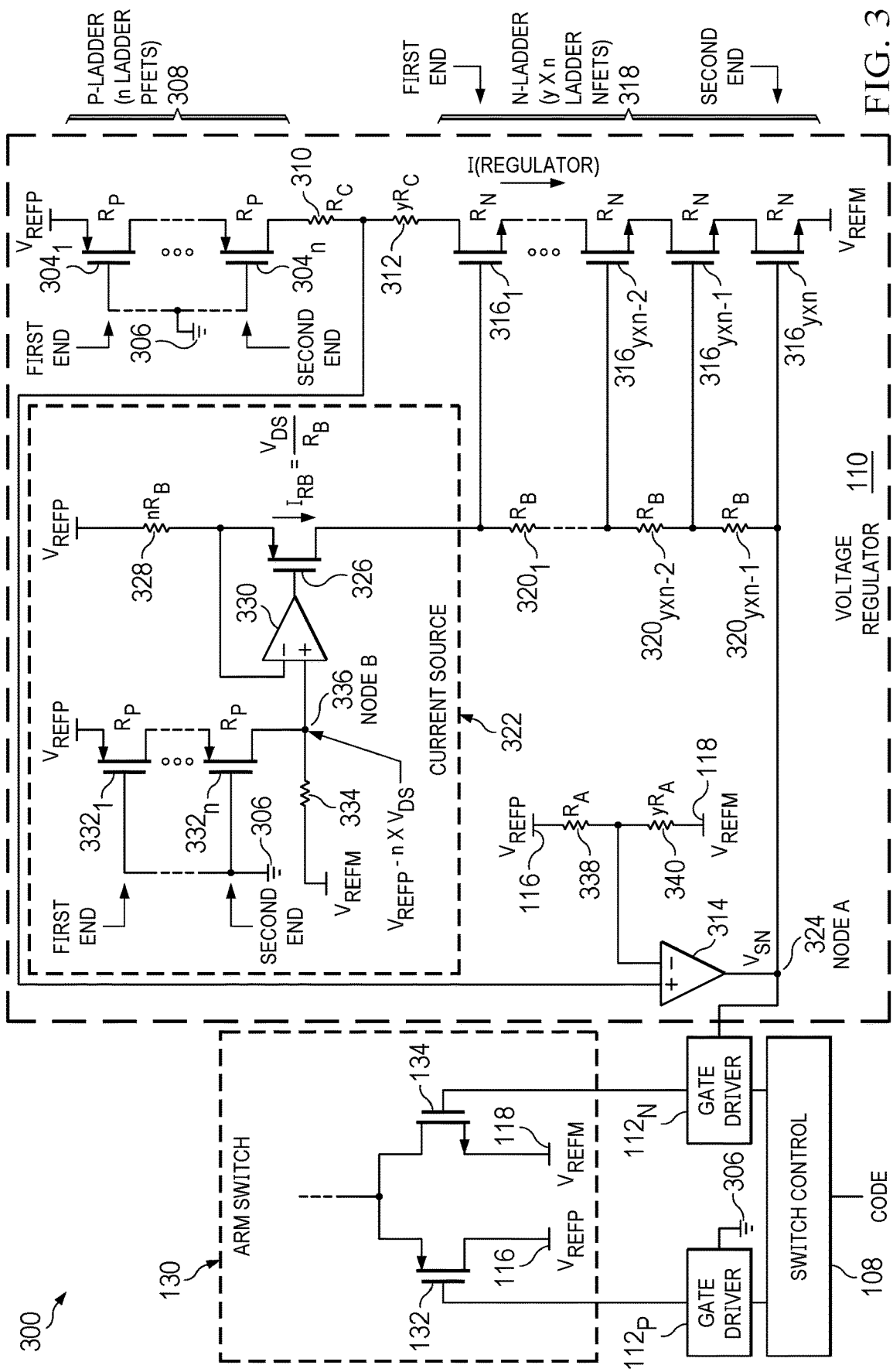
FIG. 3 is a functional block and circuit diagram of an example arm switch driving circuit, including an example voltage regulator for the gate voltage of the NMOS switches of thermometer arms and binary arms of the R2R DAC.

FIG. 3 is a functional block and circuit diagram of a circuit 300, which includes an example voltage regulator 110 coupled to a gate driver $112_N$ for providing the gate voltage of the NMOS switches 134 of the thermometer and binary arms 120 and 122. The circuit 300 also includes an arm switch 130, a gate driver 112 for PFET switches 132 (gate driver $112_P$), the gate driver for NFET switches 112 (gate driver $112_N$), and the switch control 108. In an example, voltage regulator 110, gate driver $112_P$, gate driver $112_N$, and switch control 108 of FIG. 3 are an implementation of the control circuit 106 of FIG. 1. In this example, gate driver $112_P$ and gate driver $112_N$ of FIG. 3 are, collectively, an implementation of gate driver 112 of FIG. 1. Control signals (see description of FIG. 1) provided by the switch control 108 to the gate drivers $112_p$ and $112_N$ determine which PMOS switches 132 or NMOS switches 134 the gate drivers 112 drive to activate or deactivate respective thermometric or binary arms 120 or 122.

The switch control 108 includes a first output connected to an input of the gate driver $112_P$, and a second output connected to an input of the gate driver $112_N$. The gate driver $112_P$ is connected to a ground terminal 306 that is at electrical ground, and an output of the gate driver $112_P$ is connected to the gate of the PFET switch 132. A voltage input of the gate driver $112_N$ receives a voltage $V_{SN}$, used to drive the NFET switch 134, from an output of the voltage regulator 110, as further described below. In some examples, a single voltage regulator 110 is sufficient to provide the voltage $V_{SN}$ to enable a single gate driver $112_N$ to drive the various NFET switches 134 of the R2R resistor ladder 104.

An output of the gate driver $112_N$ is connected to the gate of the NFET switch 134. In response to the code, the switch control 108 controls the gate driver $112_P$ to drive PFET switches 132 using a voltage ($V_{SS}$) at the ground terminal 306 to activate corresponding thermometer or binary arms 120 or 122. Alternatively, the switch control 108 controls the gate driver $112_N$ to drive NFET switches 134 using $V_{SN}$ to deactivate corresponding thermometer or binary arms 120 or 122. Accordingly, responsive to receiving $V_{REFP}$ and $V_{REFM}$, the voltage regulator 110 consistently provides $V_{SN}$. The switch control 108 receives the digital code and controls the gate driver $112_N$ (for example, using a set of switches) to provide $V_{SN}$ to selective ones of the NFET switches 134. Also, responsive to the digital code, the switch control 108 controls the gate driver $112_P$ to provide $V_{SS}$ to selective ones of the PFET switches 132.

The voltage regulator 110 includes n ladder PFETS, a ground terminal 306, a first resistor ($R_C$) 310 with resistance $R_C$, a second resistor ($yR_C$) 312 with resistance $y \times R_C$, a first differential amplifier 314, y×n ladder NFETS 316, y×n−1 third resistors ($R_B$ resistors) 320, a current source 322, a fourth resistor ($R_A$) 338 with resistance $R_A$, and a fifth resistor ($yR_A$) 340 with resistance $y \times R_A$. Here, n and y are integers. In some examples, n is greater than or equal to one. In some examples, y is greater than or equal to one. In some examples, y is greater than one. The current source 322 includes a first regulator PFET 326, a fourth resistor ($nR_B$) 328 with resistance $n \times R_B$, a second differential amplifier 330, n second regulator PFETS 332, and a regulator resistor 334. Use of the current source 322 with the $R_B$ resistors 320 avoids introduction of nonlinearities related to stacked drain-source voltages of the ladder NFETS 316, as further described below.

As illustrated, the high voltage rail 116 is connected to the source of a first ladder PFET 3041. The first ladder PFET 3041 is one of n cascade-coupled ladder PFETS 304 that each have equivalent resistance $R_P$ when turned on, where n is greater than or equal to one. Cascade-coupled means that the ladder PFETS 304 are connected in series, drain to source (between the high voltage rail 116 and a first terminal of $R_C$ 310), and their gates are connected together and to the ground terminal 306, to form a p-ladder 308 that includes the n ladder PFETS 304. Accordingly, the ladder PFETS 304 are turned on responsive to the R2R DAC 100 being powered and further responsive to power being provided to the high voltage rail 116. Individual ones of the ladder PFETS 304 are numbered with a subscript (from 1 to n) starting with the ladder PFET 304 closest to the high voltage rail 116.

As described above, the gates of PFET switches 132 of the thermometer arms 120 are driven by the gate driver 112p using a voltage ($V_{SS}$) at the ground terminal 306, to turn on. The gates of NFET switches 134 of the thermometer arms 120 are driven by the gate driver $112_N$ using a voltage $V_{SN}$ of a node A 324, which is coupled to or forms an output of the voltage regulator 110. Thus, node 324 may also be referred to as output 324 of the voltage regulator 110. The voltage $V_{SN}$ is determined so that when an NFET switch 134 of a thermometer arm 120 or binary arm 122 is turned on, it has an equivalent resistance close to the equivalent resistance of a PFET switch 132 of the thermometer arm 120 or binary arm 122 that is turned on (further described with respect to Equation 6).

The drain of an $n^{th}$ ladder PFET 304n is connected to a first terminal of $R_C$ 310. A second terminal of $R_C$ 310 is connected to a first terminal of $yR_C$ 312 and to a non-inverting input of the first differential amplifier 314. Herein, a first end of the ladder PFETS 304 (of the p-ladder 308) corresponds to the first ladder PFET $304_1$, and a second end of the ladder PFETS 304 corresponds to the $n^{th}$ ladder PFET $304_n$.

A second terminal of $yR_C$ 312 is connected to a drain of a first ladder NFET $316_1$. The first ladder NFET $316_1$ is one of the y×n cascade-coupled ladder NFETS 316, each with equivalent resistance $R_N$ when turned on. Accordingly, the ladder NFETS 316 are connected in series, drain to source (between the second terminal of $yR_C$ 312 and the low voltage rail 118), to form an n-ladder 318 that includes the y×n ladder NFETS 316. Individual ones of the ladder NFETS 316 are numbered with a subscript (from 1 to y×n) starting with the ladder NFET 316 connected to the second terminal of $yR_C$ 312.

The source of the $(y \times n)^{th}$ ladder NFET $316_{y \times n}$ is connected to the low voltage rail 118. The gate of the first ladder NFET $316_1$ is connected to a first terminal of a first one of y×n−1 third resistors ($R_B$ resistors) 320, each with resistance $R_B$, and to an output terminal of a current source 322. Individual ones of the $R_B$ resistors 320 are numbered with a subscript (from 1 to y×n−1) starting with the $R_B$ resistor $320_1$ connected to the gate of the first ladder NFET $316_1$. Herein, a first end of the ladder NFETS 316 (of the n-ladder 318) corresponds to the first ladder NFET $316_1$, and a second end of the ladder NFETS 316 corresponds to the $n^{th}$ ladder PFET $316_n$.

A second terminal of the first $R_B$ resistor $320_1$ is connected to a gate of the second ladder NFET $316_2$ and a first terminal of a second $R_B$ resistor $320_2$, and so on. Accordingly, the gates of adjacent ones of the n ladder NFETS 316 are connected together via respective ones of the y×n−1 $R_B$ resistors 320. The gate of the $(y \times n)^{th}$ ladder NFET $316_{y \times n}$ is connected to a second terminal of the $(y \times n−1)^{th}$ $R_B$ resistor $320_{y \times n−1}$, an output of the first differential amplifier 314, and (via the output of the voltage regulator 110) a voltage input of the gate driver $112_N$. At this connection (with the output of the first differential amplifier 314, etc.) is the node A 324 with voltage $V_{SN}$. As described above, the gate driver $112_N$ provides $V_{SN}$ to gates of NFET switches 134 to turn the NFET switches 134 on when controlled to do so by the switch control 108.

The drain-source voltage, $V_{DS}$, of each of the ladder PFETS 304 is ideally equal or the same or substantially the same subject to manufacturing process variations. Likewise, the drain-source voltage, $V_{DS}$, of each of the ladder NFETS 316 is ideally equal or the same or substantially the same. However, as described below, there is an error that accumulates in the $V_{DS}$ of increasing-subscript-numbered ladder PFETS 304 that is avoided in ladder NFETS 316 as a result of the $R_B$ resistors 320.

Description of the current source 322 follows. A drain of a first regulator PFET 326 is connected to the output terminal of the current source 322. A source of the first regulator PFET 326 is connected to a first terminal of a fourth resistor ($nR_B$) 328 with resistance $n \times R_B$ and to an inverting input of a second differential amplifier 330. A current through the first regulator PFET 326 equals $V_{DS}/R_B$;

this current is set as described below. A gate of the first regulator PFET 326 is connected to an output of the second differential amplifier 330. A second terminal of nR$_B$ 328 is connected to the high voltage rail 116.

A source of a first of n second regulator PFETS 332$_1$ is connected to the high voltage rail 116. The second regulator PFETS 332 are cascade-coupled. Accordingly, the second regulator PFETS 332 are connected in series, drain to source (between the high voltage rail 116 and node B 336), and their gates are connected together and to ground 306. Individual ones of the second regulator PFETS 332 are numbered with a subscript (from 1 to n) starting with the second regulator PFET 332$_1$ closest to the high voltage rail 116. The second regulator PFETS 332 are matched to the ladder PFETS 304. In some examples, MOSFETS being matched includes the MOSFETS being a same size or substantially the same size. In some examples, MOSFETS being matched includes matching of orientation of placement and/or use of matched dummy fingers and/or use of matched interleaving, meaning that these parameters are the same or substantially the same across the matched MOSFETS.

As mentioned above, the drain-source voltage of each of the second regulator PFETS 332 is V$_{DS}$, subject to the error referred to above and further described below. A drain of the n$^{th}$ second regulator PFET 332$_n$ is connected to a non-inverting input of the second differential amplifier 330 and a first terminal of a regulator resistor 334. At this connection (with the non-inverting input of the second differential amplifier 330, etc.) is the node B 336 that has voltage V$_{REFP}$−n×V$_{DS}$. A second terminal of the regulator resistor 334 is connected to the low voltage rail 118. A resistance of the regulator resistor 334 is selected so that a source-drain current flowing through the second regulator PFETS 332 is equal to a source-drain current flowing through the ladder PFETS 304. This, along with the matching described above, leads to the V$_{DS}$ of the second regulator PFETS 332 becoming equal to the V$_{DS}$ of the ladder PFETS 304. Herein, a first end of the second regulator PFETS 332 corresponds to the second regulator PFET 332$_1$ closest to the high voltage rail 116, and a second end of the second regulator PFETS 332 corresponds to the n$^{th}$ second regulator PFET 332$_n$.

The second differential amplifier 330 sets the voltage at its output so that the voltage at its inverting input equals the voltage at node B 336, V$_{REFP}$−n×V$_{DS}$. Accordingly, the voltage across nR$_B$ 328, which is the difference between V$_{REFP}$ and V$_{REFP}$−n×V$_{DS}$, equals n×V$_{DS}$. This means that the current (I$_{RB}$) provided by the current source 322 equals the voltage across nR$_B$ 328 divided by the resistance of nR$_B$ 328, as shown in Equation 3:

$$I_{RB} = \frac{n \times V_{DS}}{n \times R_B} = \frac{V_{DS}}{R_B} \quad \text{Equation 3}$$

A first terminal of a fourth resistor (R$_A$) 338 with resistance R$_A$ is connected to the high voltage rail 116. A second terminal of R$_A$ 338 is connected to an inverting terminal of the first differential amplifier 314 and to a first terminal of a fifth resistor (yR$_A$) 340 with resistance y×R$_A$. A second terminal of yR$_A$ 340 is connected to the low voltage rail 118. This portion of the voltage regulator (including R$_A$ 338 and yR$_A$ 340) sets a target voltage for the inverting input of the differential amplifier 314.

Negative feedback causes the voltage at the non-inverting input of the differential amplifier 314 to become equal (or substantially equal) to this target voltage. This causes the on resistance (R$_N$) of the ladder NFETS 316 to become equal (or substantially equal) to the on resistance (R$_P$) of the ladder PFETS 304. The negative feedback also causes the on resistance (R$_{NLADDER}$) of individual NFET switches 134 in thermometer arms 120 and binary arms 122 to become equal (or substantially equal) to the on resistance (R$_{PLADDER}$) of individual PFET switches 132 in thermometer arms 120 and binary arms 122. Taking into account non-ideal circuit behavior, the difference between R$_P$ and R$_N$, and the difference between R$_{PLADDER}$ and R$_{NLADDER}$, are governed by Equations 4 through 8 (described below).

The current I$_{RB}$ is used to equalize the gate-source voltages (V$_{GS}$) of the ladder NFETS 316. The (y×n)$^{th}$ ladder NFET 316$_{y×n}$ has gate voltage V$_{SN}$ and source voltage V$_{REFM}$. If the R$_B$ resistors 320 were not present, then the (y×n−1)$^{th}$ ladder NFET 316$_{y×n−1}$ would have gate voltage V$_{SN}$ and source voltage V$_{REFM}$+V$_{DS}$. The (y×n−2)$^{th}$ ladder NFET 316$_{y×n−2}$ would have gate voltage V$_{SN}$ and source voltage V$_{REFM}$+2×V$_{DS}$. And so on . . . except that the V$_{DS}$ of each successive ladder NFET 316 would be slightly different, introducing a successively increasing error, because the V$_{GS}$ of each successive ladder NFET 316 would be slightly different.

The current I$_B$ across the R$_B$ resistors 320 addresses this cumulative error. There is a voltage drop of R$_B$×I$_B$=R$_B$×V$_{DS}$/R$_B$=V$_{DS}$ across each of the R$_B$ resistors 320. Accordingly, the (y×n−1)$^{th}$ ladder NFET 316$_{y×n−1}$ has gate voltage V$_{SN}$+V$_{DS}$ and source voltage V$_{REFM}$+V$_{DS}$. The (y×n−2)$^{th}$ ladder NFET 316$_{y×n−2}$ has gate voltage V$_{SN}$+V$_{DS}$ and source voltage V$_{REFM}$+2×V$_{DS}$. And so on, so that each (matched) ladder NFET 316 has the same gate-source voltage and, as a result, the same V$_{DS}$.

A difference between R$_{PLADDER}$ and R$_{NLADDER}$ is given by Equation 4:

$$R_{PLADDER} - R_{NLADDER} = V_{OS} \times \frac{1+y}{y} \times \frac{1}{n} \times \frac{R_N}{V_{DS}} \times \frac{1}{k} \quad \text{Equation 4}$$

V$_{OS}$ is the offset voltage of the first differential amplifier 314 (present due to non-ideal characteristics of the first differential amplifier 314). The scaling factor k relates R$_N$ to R$_{NLADDER}$. Accordingly, k is given by Equation 5:

$$k = \frac{R_N}{R_{NLADDER}} \quad \text{Equation 5}$$

If the drain-source voltages of the stacked ladder NFETS 316 are equal, then an accuracy of Equation 4 is enhanced. R$_{PLADDER}$−R$_{NLADDER}$ can be determined from an INL target (an INL design budget) as described in Equation 6:

$$\text{maximum } INL = (R_{PLADDER} - R_{NLADDER}) \times 2^N / (8 \times R) \quad \text{Equation 6}$$

In Equation 6, maximum INL is the INL target, R is the R resistance unit used in FIG. 1, and N is the bit resolution of the R2R DAC 100. R$_{NLADDER}$ can be described in terms of the difference R$_{PLADDER}$−R$_{NLADDER}$ as shown in Equation 7:

$$R_{NLADDER} = \frac{y \times n \times V_{DS}}{(1+y) \times V_{OS}} \times (R_{PLADDER} - R_{NLADDER}) \quad \text{Equation 7}$$

As y increases, the corresponding term in Equation 4 goes from two (if y equals one) towards one. Equation 4 shows that increasing y and/or n decreases the difference between $R_{PLADDER}$ and $R_{NLADDER}$. In some examples, as size of a transistor decreases its on resistance increases, and as the size a transistor increases its on resistance decreases. Accordingly, Equations 4, 5, and 7 show that use of the offset factor y, where y is greater than one, enables use of an $R_{NLADDER}$ that is $2y/(1+y)$ times higher than without the offset factor y (equivalently, if y equals one). Thus, the offset factor y enables use of an NFET switch 134 size that is $(1+y)/2y$ times the size than otherwise. In some examples, if y equals five, then the NFET switch 134 size can be ⅗ the size than if y equals one.

In some examples, the $V_{GS}$ error due to stacking ladder PFETS 306 and regulator PFETS 332 is not corrected, so n is relatively small to avoid accumulation of corresponding non-linearity. Using the $R_B$ resistors 320 to equalize the gate-source voltages of the ladder NFETS 316 enables a relatively large number of ladder NFETS 316 to be stacked, i.e., y can be relatively large. Thus, use of the resistance offset y enables non-linearity to be reduced, which enables the number of stacked ladder NFETS 316 to be increased, increasing $R_{NLADDER}$ (and reducing NFET switch 134 size) as described in Equation 7. Accordingly, smaller PFET switches 132 and NFET switches 134 can be used without increasing non-linearity due to inequalities in PFET and NFET switch 132 and 134 resistances. In an example, y equals 5, n equals 2, $R_{PLADDER}-R_{NLADDER}$ equals 0.4 Ohms (Ω), $V_{DS}$ equals 20 millivolts (mV), and $V_{OS}$ equals 2 mV, so that (using Equation 7) $R_{NLADDER}$ equals 6.7Ω.

As described above, $R_{NLADDER}$ is determined using Equation 7, and can be used to determine the size or width/length (W/L) ratio of the NFET switch 134. $R_{PLADDER}$, which can be used to determine the size or W/L ratio of the PFET switch 132, is given by Equation 8:

$$\frac{R_{PLADDER}}{R_{NLADDER}} = \frac{R_P}{R_N} \qquad \text{Equation 8}$$

In some examples, the PFET switches 132, NFET switches 134, and transistors in the p-ladder 308 and n-ladder 318 are operated deep in the triode region. For transistors in the triode region, $V_{DS} I_{DS} \times R_{ON}$. Accordingly, Equation 5 can be rewritten as shown in Equation 9, which relates certain currents and voltages of the arm switches 130 of the thermometer arms 120 and binary arms 122 to certain currents and voltages of the voltage regulator 110:

$$k = \frac{V_{DS\_REGULATOR}}{V_{DS\_LADDER}} \times \frac{I_{LADDER}}{I_{REGULATOR}} \qquad \text{Equation 9}$$

$V_{DS\_LADDER}$ is the drain-source voltage across, and $I_{LADDER}$ is the current through, a turned-on PFET switch 132 or NFET switch 134 in each thermometer arm 120 and binary arm 122. $I_{LADDER}$ equals $V_{REF}/(4 \times R)$, where $V_{REF}$ equals $V_{REFP}-V_{REFM}$ and R is the R resistance unit used in FIG. 1. $V_{DS\_REGULATOR}$ is the drain-source voltage across, and $I_{REGULATOR}$ is the current through, a turned-on ladder PFET 304 in the p-ladder 308 or ladder NFET 316 in the n-ladder 318. In an example, $I_{REGULATOR}$ equals $I_{LADDER}$, $V_{REF}$ equals 5 V, and R equals 128 kΩ, so that I(ladder) equals 10 microAmps, $V_{DS}$(ladder) equals 67 microvolts (µV), $V_{DS\_REGULATOR}$ equals 20 mV, and k is approximately 300 (20 mV/67 µV), so that $R_N$ is approximately 2 kΩ. Thus, in the described example, ladder PFETS 304 and ladder NFETS 316 can be manufactured with an equivalent resistance of 2 kΩ using an available process node. In some examples, properties of the various transistors are further adjusted to address second order effects.

Accordingly, matching $V_{GS}$ and $V_{DS}$ values of the ladder NFETS 316 enables the voltage regulator 110 to more accurately regulate a gate voltage of the NFET switches 134 of the thermometer and binary arms 120 and 122 to reduce a difference between $R_{PLADDER}$ and $R_{NLADDER}$. Also, the resistance offset y enables a larger number of stacking ladder NFETS 316 to be used, further enabling the voltage regulator 110 to more accurately regulate a gate voltage of the NFET switches 134 of the thermometer and binary arms 120 and 122 to reduce the difference between $R_{PLADDER}$ and $R_{NLADDER}$. Reducing the difference between $R_{PLADDER}$ and $R_{NLADDER}$ enables the R2R resistor ladder 104 to reduce a size of the NFET switches of the thermometer and binary arms 120 and 122 while meeting a same non-linearity budget.

Figure 4:
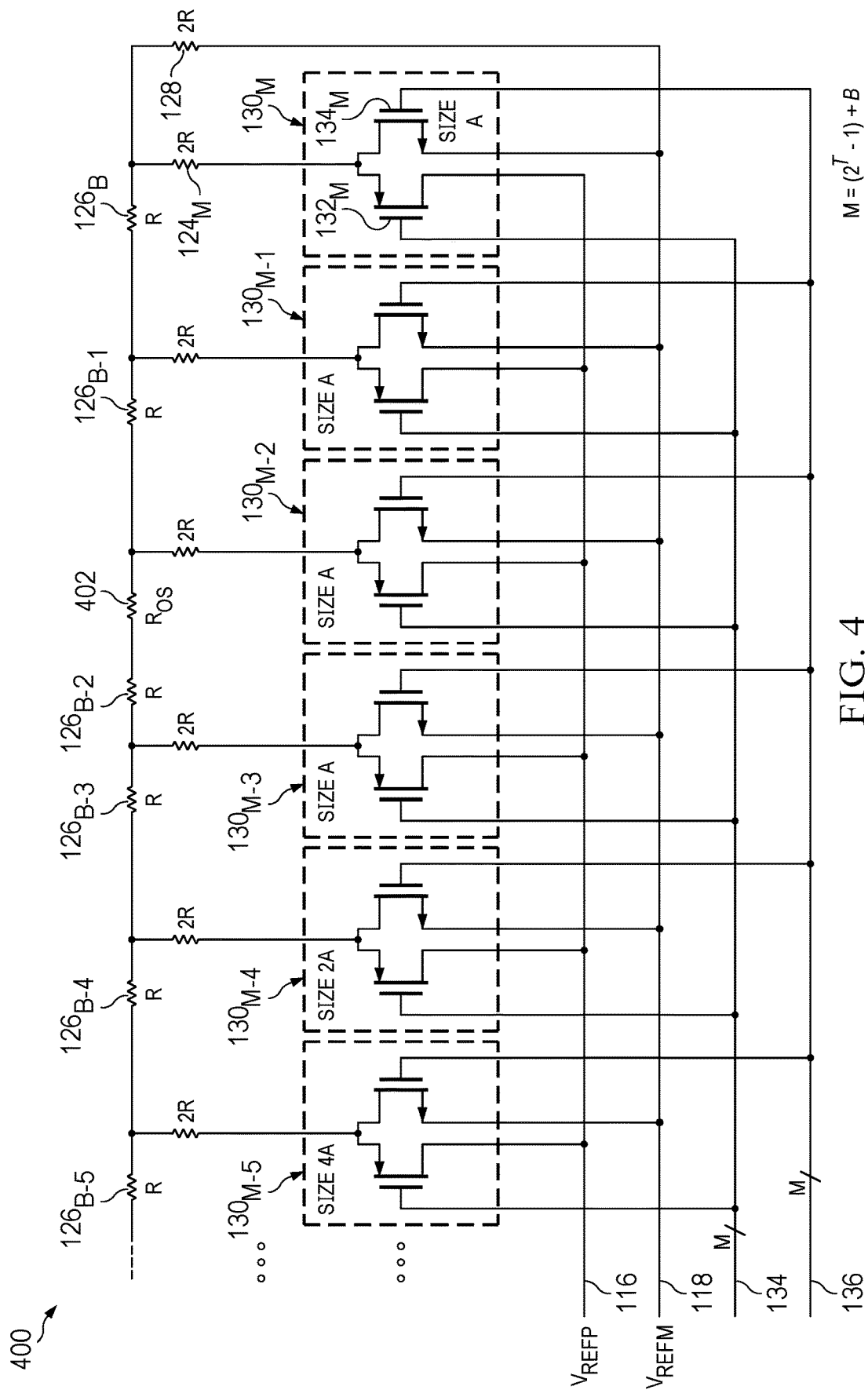
FIG. 4 is a circuit diagram of another example R2R DAC.

FIG. 4 is a circuit diagram of an example R2R resistor ladder 400. In an example, the R2R resistor ladder 400 is an implementation of the R2R resistor ladder 104 of FIG. 1. The R2R resistor ladder 400 includes structures corresponding to the R2R resistor ladder 104 of FIG. 1, with an additional offset resistor ($R_{OS}$) 402 having a resistance $R_{OS}$. The resistor $R_{OS}$ 402 has a first terminal coupled to a second terminal of a $P^{th}$ connector resistor $126_P$. The resistor $R_{OS}$ 402 has a second terminal coupled to a first terminal of a $(P+1)^{th}$ connector resistor $126_{P+1}$ and to a terminal of arm resistor $124_{2^T-1+P}$, which is connected to the $(2^T-1+P)^{th}$ arm switch $130_{2^T-1+P}$. In the illustrated example, P equals B−2, corresponding to the $(B-2)^{th}$ connector resistor $126_{B-2}$ and the $(M-2)^{th}$ arm switch $130_{M-2}$. In some examples, $R_{OS}$ 402 is implemented as an additional resistance that is part of the $P^{th}$ connector resistor $126_P$.

In some examples, due to properties of an R2R resistor ladder 104, the PFET switch 132 in an arm switch 130 of a $(j+1)^{th}$ binary arm $122_{j+1}$ has double the total resistance—and accordingly, half the size—of the PFET switch 132 in an arm switch 130 of a $j^{th}$ binary arm $122_j$. Similarly, the NFET switch 134 in an arm switch 130 of a $(j+1)^{th}$ binary arm $122_{j+1}$ has double the total resistance and half the size of the NFET switch 134 in an arm switch 130 of a $j^{th}$ binary arm $122_j$. Thermometric arms 120 may be considered zeroth binary arms 122 with respect to this scaling. Scaling of PFET switches 132 and NFET switches 134 in binary arms is done to keep the R2R resistor ladder 104 balanced.

In some examples, doubling the resistance by halving the size of each successive PFET switch 132/NFET switch 134 pair means that, for the smallest PFET switch 132 and NFET switch 134 (switches on the LSB binary arm 122) to be fabricated by an available process, the largest PFET switches 132 and NFET switches 134 (switches of thermometer arms 120) take up a relatively large amount of device area. In some examples, device area limits a maximum size (and accordingly, a minimum resistance) of PFET switches 132 and NFET switches 134.

Conversely, a smallest switch size may be reached before the LSB arm switch $130_N$ (the arm switch 130 of the $B^{th}$ binary arm $122_B$). In some examples, series stacking of MOSFETS in arm switches 130 is used to compensate for unavailability of smaller switch sizes. In some examples, switch stacking results in additional DNL contributions due to issues such as the $V_{GS}$ and $V_{DS}$ issues described with respect to FIG. 3. Significant additional area cost may be used to compensate for such DNL-generating issues, and switch speed cost may be attributed to the compensating structures.

Further, as described, resistances of PFET switches 132 and NFET switches 134 increase as arm switch 130 subscript number increases (in an LSB binary arm 122 direction). Accordingly, $V_{DS}$ of PFET switches 132 and NFET switches 134 also increases as binary arm 122 arm switch 130 subscript number increases. As the $V_{DS}$ of PFET switches 132 and NFET switches 134 increases, the accuracy of the resistances of the PFET switches 132 and NFET switches 134 decreases—namely, process error increases. In some examples, switch resistance accuracy degrades sufficiently that PFET switches 132 and NFET switches 134 operate in saturation mode instead of triode mode.

In some examples, to reduce or prevent these issues, the sizes of PFET switches 132 and NFET switches 134 after a $(P-1)^{th}$ binary arm 122 arm switch $130_{P-1}$ ($P^{th}$ binary arm 122 arm switch $130_P$, $(P+1)^{th}$, etc.) are held equal to the size of the $(P-1)^{th}$ binary arm 122 arm switch $130_{P-1}$. This is referred to as "stop scaling," in which scaling down of successive arm switches 130 is stopped following the $(P-1)^{th}$ binary arm 122 arm switch $130_{P-1}$.

In the R2R resistor ladder 400, switch sizes are indicated by labels "size A," "size 2 A," "size 4 A," etc. As described above, in the example R2R resistor ladder 400 of FIG. 4, P equals B−2. Accordingly, the PFET switches 132 and NFET switches 134 of the $(P-1)^{th}$ binary arm 122 arm switch $130_{P-1}$ and less significant bit arm switches 130 (arm switches $130_P$, $130_{P+1}$, and so on) have respective sizes corresponding to size A. In some examples, PFET switches 132 and NFET switches 134 have a same size corresponding to a size A. In some examples, size A indicates a size for PFET switches 132 that is different from a size for NFET switches 134. The PFET switches 132 and NFET switches 134 of the $(P-2)^{th}$ binary arm 122 arm switch $130_{P-2}$ have respective sizes corresponding to size 2 A. The PFET switches 132 and NFET switches 134 of the $(P-3)^{th}$ binary arm 122 arm switch $130_{P-3}$ have respective sizes corresponding to size 4 A; and so on.

Stop scaling causes $P^{th}$ and later (lower significant bit) arm switches 130 to contribute additional DNL. In some examples, the $P^{th}$ binary arm 122 contributes an additional DNL due to stop scaling, and each successive arm after the $P^{th}$ binary arm 122 contributes half as much DNL due to stop scaling. The DNL contribution is caused by mismatch in looking-in impedance between the binary arm 122 where the binary scaling of switch sizes is stopped and higher significant bit binary arms 122.

The looking-in impedance ($R_{eq}$) at a binary arm 122 of the R2R resistor ladder 104 equals 2R plus an equivalent resistance component ($R_{SW}$) contributed by the corresponding arm switch 130. In a balanced R2R resistor ladder 104, in which the unit resistances R are the same and the arm switches 130 follow the binary scaling rule, the $R_{eq}$ values of the binary arms 122 are the same. Stop scaling lowers the $R_{SW}$ of the binary arm 122 to which stop scaling is applied (the $P^{th}$ binary arm $122_M$). The difference in $R_{SW}$ makes the $R_{eq}$ of the $P^{th}$ binary arm $122_M$ lower than the $R_{eq}$ of higher significant bit binary arms 122. The difference in $R_{eq}$ causes the additional DNL contribution of stop scaling. A maximum magnitude of DNL caused by stop scaling is reduced using the offset resistor ($R_{OS}$) 402, as further described with respect to FIGS. 5A, 5B, and 6.

Figure 5A:
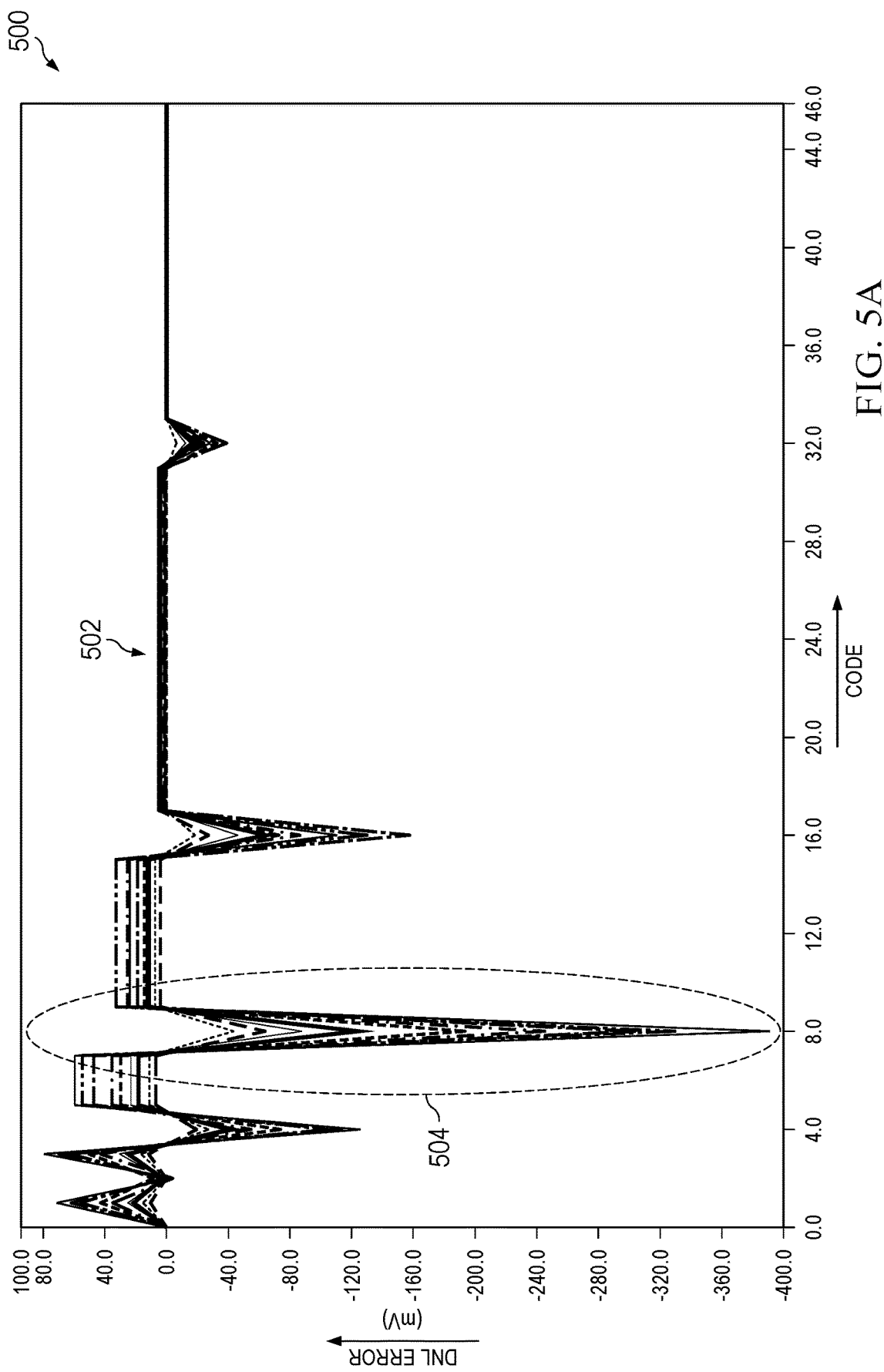
FIG. 5A is an example graph of DNL error against code for the R2R DAC of FIG. 1.

FIG. 5A is an example graph 500 of DNL error against code for the R2R DAC 100 of FIG. 1. In the illustrated example, stop scaling is applied, so that a DNL error plot 502 shows a relatively large maximum DNL error peak 504 at a code corresponding to an arm switch 130 to which scaling was not applied.

Figure 5B:
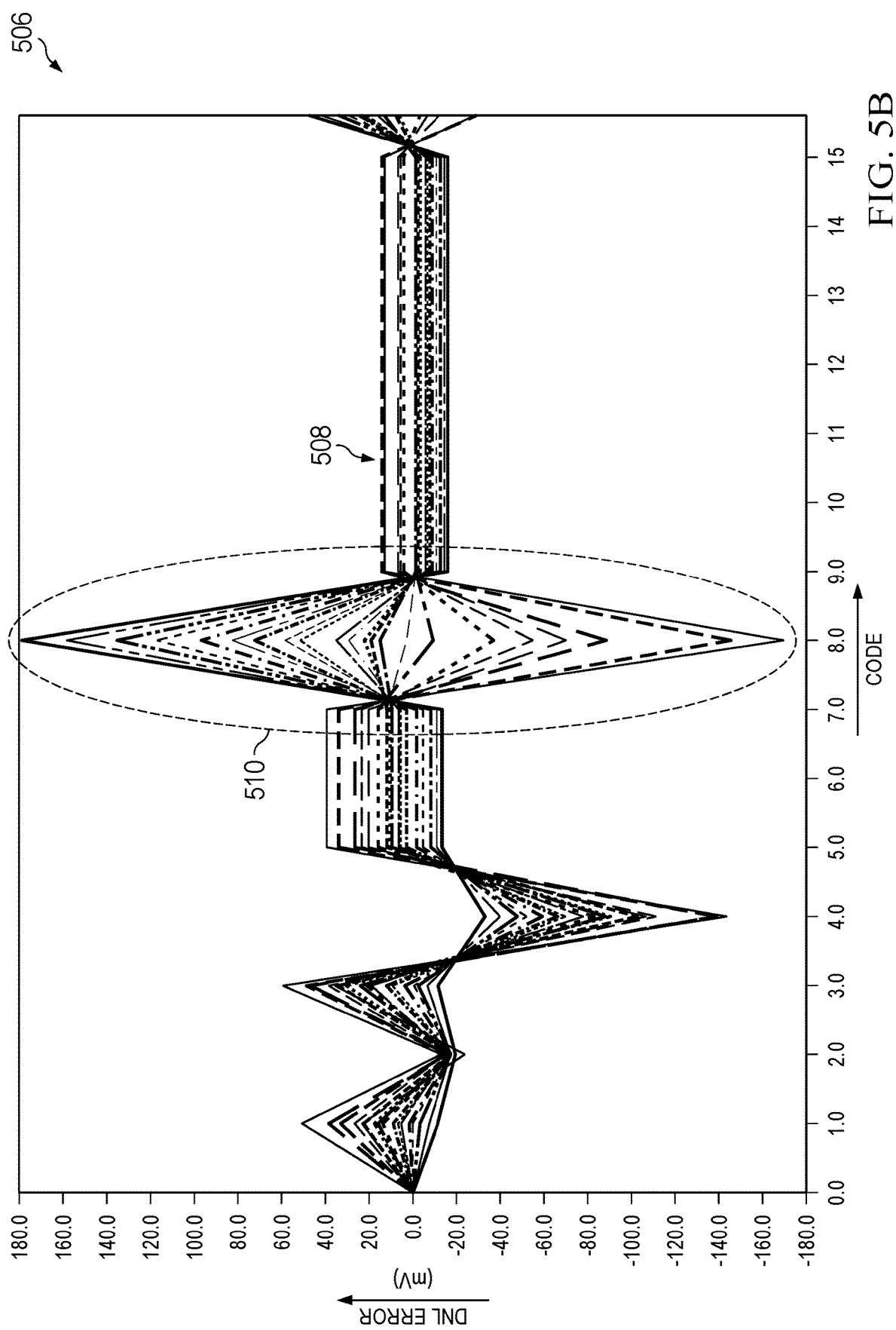
FIG. 5B is an example graph of DNL against code for the R2R DAC of FIG. 4.

FIG. 5B is an example graph 506 of DNL against code for an R2R DAC using the R2R resistor ladder 400 of FIG. 4. The graph 506 includes a DNL error plot 508. In the illustrated example, stop scaling is applied. However, $R_{OS}$ 402 causes DNL error 510 at a code corresponding to an arm switch 130 to which scaling was not applied to shift. This causes a DNL error range for the arm switch 130 to which scaling was not applied is spaced over a positive range to a negative range. Accordingly, a maximum magnitude of the DNL error 510 is reduced. In some examples, the total of a preexisting maximum DNL magnitude plus a maximum DNL magnitude contributed by stop scaling is halved.

Figure 6:
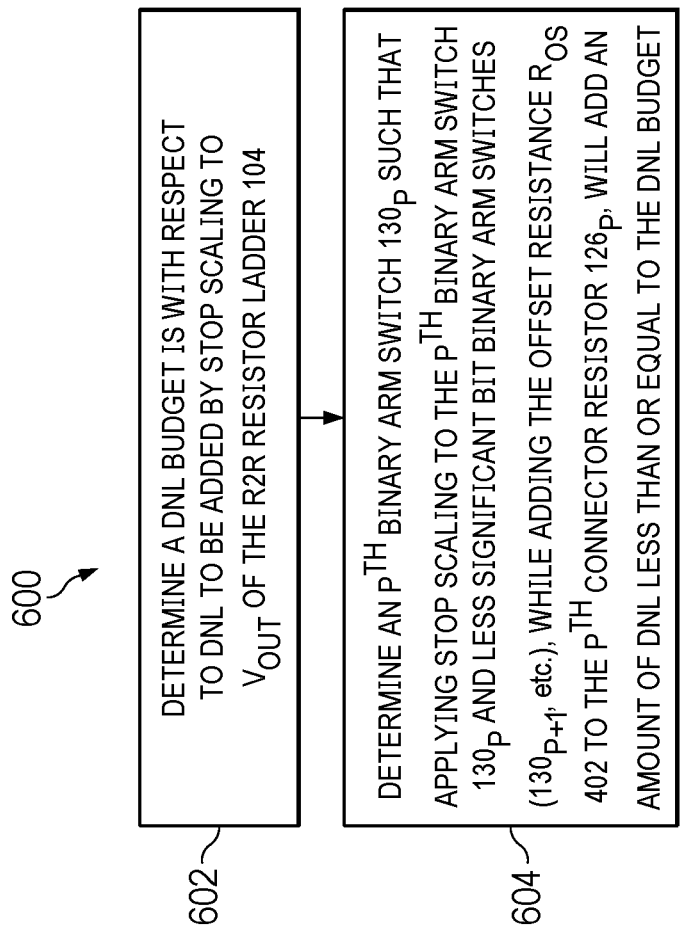
FIG. 6 is an example process for determining where to place an offset resistance to enable stop scaling with respect to arm switches of least significant bit binary arms of the R2R resistor ladder.

FIG. 6 is an example process for determining where to place the offset resistance $R_{OS}$ 402 to enable stop scaling with respect to arm switches 130 of least significant bit binary arms 122 of the R2R resistor ladder 104. In step 602, a DNL budget is determined with respect to DNL to be added by stop scaling to $V_{OUT}$ of the R2R resistor ladder 104. In some examples, a DNL budget of 0.2 LSB, or another amount less (or much less) than one LSB, is used as a DNL budget for an R2R DAC 100. In step 604, a $P^{th}$ binary arm switch $130_M$ is determined such that applying stop scaling to the $P^{th}$ binary arm switch $130_P$ and less significant bit binary arm switches ($130_{P+1}$, etc.), while adding the offset resistance $R_{OS}$ 402 to the $P^{th}$ connector resistor $126_P$, will add an amount of DNL less than or equal to the DNL budget. In some examples, DNL can be expressed as a function of P, and P can be determined in response to the DNL budget. In some examples, P is determined empirically.

Figure 7:
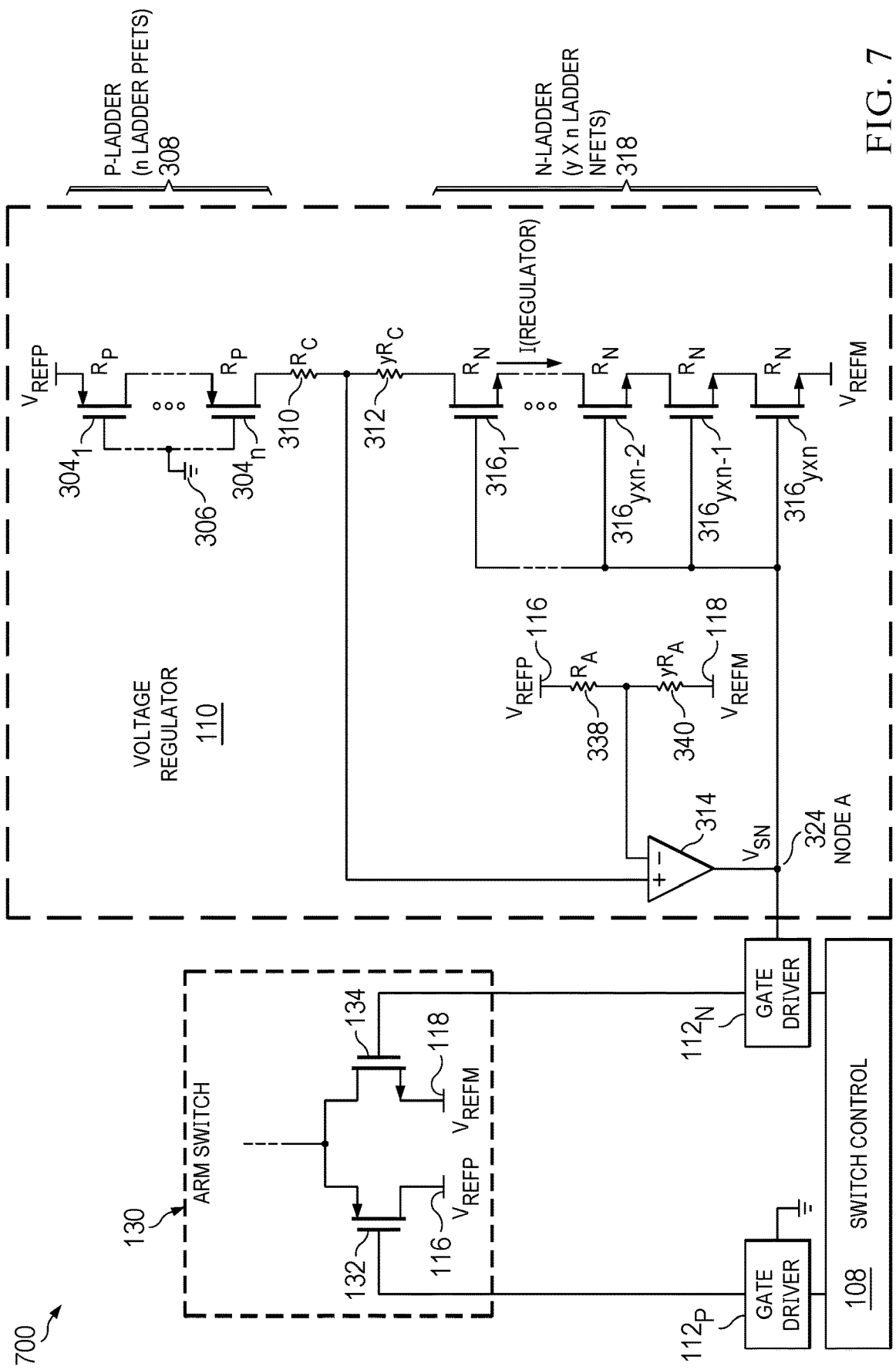
FIG. 7 is a functional block and circuit diagram of an alternative example arm switch driving circuit, including an example voltage regulator for the gate voltage of the NMOS switches of the thermometer arms and binary arms of the R2R DAC.

FIG. 7 is a functional block and circuit diagram of an alternative example circuit 700, including an alternative example voltage regulator 110 for the gate voltage of the NMOS switches 134 of the thermometer arms 120 and binary arms 122. The voltage regulator 110 of FIG. 7 is similar to the voltage regulator 110 of FIG. 3. However, the voltage regulator 110 of FIG. 7 does not include the third resistors ($R_B$) 318 and current source 322 of FIG. 3. The voltage regulator 110 of FIG. 3 includes the second resistor ($yR_C$) 312 with resistance $y \times R_C$ and the n-ladder 318. Accordingly, the voltage regulator 110 of FIG. 700 provides corresponding reduction of the sizes of $R_{PLADDER}$ and $R_{NLADDER}$ as described with respect to FIG. 3. In some examples, as described with respect to FIG. 3, DNL is contributed by uncorrected mismatch between $V_{GS}$ of the ladder NFETs 316.

Modifications are possible in the described examples, and other examples are possible within the scope of the claims.

In some examples, an R2R resistor ladder includes zero or more thermometer arms and two or more binary arms.

In some examples, reference herein to a smallest MOSFET size refers to a MOSFET with a smallest width or length (or other) dimension available within a corresponding manufacturing process.

In some examples, a resistor ladder other than an R2R resistor ladder is used. In some examples, resistances of connector resistors 124 or arm resistors 126 are deliberately varied, such as to induce deliberate DNL values or signs of values to facilitate trimming.

In some examples, a similar current source and resistor arrangement is included to equalize $V_{GS}$ of ladder PFETS as is used with respect to $V_{GS}$ of ladder NFETS. In some examples, this is not done because there is insufficient voltage range (headroom) to do so. In some examples, there is insufficient headroom to do so because the R2R resistor ladder 104 is designed to have a voltage swing from a low(est) rail of a corresponding IC to a high(est) rail of the IC.

In some examples, ladder PFETS 306 and PFET switches 132 are matched (or design techniques are applied that correspond to matching), and/or ladder NFETS 316 and NFET switches 134 are matched (or design techniques are applied that correspond to matching). For example, matching can be applied using a same orientation of placement, same use of dummy devices, and same use of equal sized fingers. For example with respect to equal sized figures, if a ladder NFET 306 is designed as a single finger PFET having a unit width and a unit length, then an NFET switch is designed as a multi-finger PFET having a number X fingers, ones of the fingers having unit width and unit length. In some examples, X is much larger than one.

In some examples, one or more offset resistors is added between one or more pairs of connector resistors with higher-numbered subscripts (lower bit significance) than the $M^{th}$ and $(M+1)^{th}$ connector resistors, to further decrease the maximum magnitude of DNL caused by stop scaling.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin", "ball" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a MOSFET (such as an n-channel MOSFET, nMOSFET, or a p-channel MOSFET, pMOSFET), a bipolar junction transistor (BJT—such as NPN or PNP), insulated gate bipolar transistors (IGBTs), junction field effect transistor (JFET), and/or other field effect transistor (FET—such as an n-channel or p-channel FET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs). Also, a control terminal in a FET corresponds to a base on a BJT or a gate or other corresponding structure in an other type of transistor.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples may be included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means within +/−10 percent of the stated value, or, if the value is zero, a reasonable range of values around zero.

What is claimed is:

1. An integrated circuit (IC) comprising:
 a first resistor having a first terminal and a second terminal and having resistance R1;
 N p-channel field-effect transistors (ladder PFETS) coupled together as a p-ladder, each ladder PFET having a source, a drain, and a gate, in which N is an integer greater than or equal to one, wherein if N is greater than one the ladder PFETS are coupled together as a p-ladder, so that the gates of the ladder PFETS are coupled together, the drains and sources of the ladder PFETS are cascade-coupled between a first end and a second end of the p-ladder, and the second end of the p-ladder is coupled to the first terminal of the first resistor;

a differential amplifier including a first input, a second input, and an output;

a second resistor including a first terminal and a second terminal and having resistance y×R1, in which y is an integer greater than one, and a first terminal of the second resistor is coupled to the second terminal of the first resistor and the first input of the differential amplifier; and y×N n-channel field-effect transistors (ladder NFETS) coupled together as an n-ladder, each ladder NFET having a source, a drain, and a gate, the gates of the ladder NFETS coupled together, the drains and sources of the ladder NFETS cascade-coupled between a first end and a second end of the n-ladder, the first end of the n-ladder coupled to the second terminal of the second resistor, and the second end of the n-ladder coupled to the output of the differential amplifier.

2. The IC of claim 1, further comprising:
a third resistor having a first terminal, a second terminal, and resistance R2; and
a fourth resistor having a first terminal, a second terminal, and resistance y×R2, the first terminal of the fourth resistor coupled to the second terminal of the third resistor and to the second input of the differential amplifier.

3. The IC of claim 1, further comprising:
a gate driver including an input and multiple outputs, the input of the gate driver coupled to the output of the differential amplifier; and
an R2R resistor ladder including multiple arms coupled together, at least some of the arms respectively including a p-channel field effect transistor (a PFET switch) and an n-channel field effect transistor (an NFET switch), in which a source of the NFET switch is coupled to a source of the PFET switch and a gate of the NFET switch is coupled to a different one of the outputs of the gate driver than the gates of the NFET switches of the other arms.

4. The IC of claim 1,
further comprising y×N−1 third resistors, each of the third resistors having a resistance R2;
wherein different pairs of the ladder NFETS that are adjacently coupled drain-to-source within the n-ladder have respective gates coupled together via different ones of the third resistors.

5. The IC of claim 4,
wherein each of the third resistors has a first terminal and a second terminal;
further comprising a current source having a first terminal and a second terminal, the second terminal of the current source coupled to the gate of the ladder NFET at the first end of the n-ladder and coupled to the first terminal of one of the third resistors.

6. The IC of claim 5,
wherein each of the ladder NFETS, when activated, is configured to have a drain-source voltage $V_{DS}$; and
wherein the current source is configured to provide a current equal to $V_{DS}$ divided by R2.

7. The IC of claim 5, wherein the ladder PFETS are first PFETS, the p-ladder is a first p-ladder, the differential amplifier is a first differential amplifier, and the current source includes:
a second differential amplifier including a first input, a second input, and an output;
a second PFET having a source, a drain, and a gate, the gate of the second PFET coupled to the output of the second differential amplifier, and the drain of the second PFET coupled to the second terminal of the current source;
a fourth resistor having a first terminal, a second terminal, and resistance N×R2, the first terminal of the fourth resistor coupled to the first input of the second differential amplifier and the source of the second PFET;
a fifth resistor having a first terminal and a second terminal; and
N third PFETS, each of which have a source, a drain, and a gate, wherein if N is greater than one the third PFETS are coupled together as a second p-ladder, so that the gates of the third PFETS are coupled together, the drains and sources of the third PFETS are cascade-coupled between a first end and a second end of the second p-ladder, and the second end of the second p-ladder is coupled to the first terminal of the fifth resistor and the second input of the second differential amplifier.

8. An integrated circuit (IC) comprising:
a first resistor having a first terminal, a second terminal, and resistance R1;
N p-channel field-effect transistors (ladder PFETS), each ladder PFET having a source, a drain, and a gate, in which N is greater than or equal to one, wherein if N is greater than one the ladder PFETS are coupled together as a p-ladder, so that the gates of the ladder PFETS are coupled together, the drains and sources of the ladder PFETS are cascade-coupled between a first end and a second end of the p-ladder, and the second end of the p-ladder is coupled to the first terminal of the first resistor;
a differential amplifier including a first input, a second input, and an output;
a second resistor having a first terminal, a second terminal, and resistance y×R1, in which y is an integer greater than or equal to one so that y×N is greater than one, and a first terminal of the second resistor is coupled to the second terminal of the first resistor and the first input of the differential amplifier;
y×N−1 third resistors, each of the third resistors having a resistance R2; and
y×N n-channel field-effect transistors (ladder NFETS) coupled together as an n-ladder, each ladder NFET having a source, a drain, and a gate, the drains and sources of the ladder NFETS cascade-coupled between a first end and a second end of the n-ladder, the first end of the n-ladder coupled to the second terminal of the second resistor, and the second end of the n-ladder coupled to the output of the differential amplifier;
wherein different pairs of the ladder NFETS that are adjacently coupled drain-to-source within the n-ladder have respective gates coupled together via different ones of the third resistors.

9. The IC of claim 8, wherein y is greater than one.

10. The IC of claim 8, further comprising:
a fourth resistor having a first terminal, a second terminal, and resistance R3; and a fifth resistor having a first terminal, a second terminal, and resistance y×R2, the first terminal of the fifth resistor coupled to the second terminal of the fourth resistor and to the second input of the differential amplifier.

11. The IC of claim 8, further comprising:
a gate driver including an input and multiple outputs, the input of the gate driver coupled to the output of the differential amplifier;
an R2R resistor ladder including multiple arms coupled together, at least some of the arms respectively including a p-channel field-effect transistor (PFET switch) and an n-channel field effect transistor (NFET switch), in which a source of the NFET switch is coupled to a source of the PFET switch and a gate of the NFET switch is coupled to a different one of the outputs of the gate driver than the gates of the NFET switches of the other arms.

12. The IC of claim 8,
wherein each of the third resistors has a first terminal and a second terminal;
further comprising a current source having a first terminal and a second terminal, the second terminal of the current source coupled to the gate of the ladder NFET at the first end of the n-ladder and coupled to the first terminal of one of the third resistors.

13. The IC of claim 12,
wherein each of the ladder NFETS, when activated, is configured to have a drain-source voltage $V_{DS}$; and
wherein the current source is configured to provide a current equal to $V_{DS}$ divided by R2.

14. The IC of claim 12, wherein the ladder PFETS are first PFETS, the p-ladder is a first p-ladder, the differential amplifier is a first differential amplifier, and the current source includes:
a second differential amplifier including a first input, a second input, and an output;
a second PFET having a source, a drain, and a gate, the gate of the second PFET coupled to the output of the second differential amplifier, and the drain of the second PFET coupled to the second terminal of the current source;
a fourth resistor having a first terminal, a second terminal, and resistance N×R2, the first terminal of the fourth resistor coupled to the first input of the second differential amplifier and the source of the second PFET;
a fifth resistor having a first terminal and a second terminal; and
N third PFETS, each of which includes a source, a drain, and a gate, wherein if N is greater than one the third PFETS are coupled together as a second p-ladder, so that the gates of the third PFETS are coupled together, the drains and sources of the third PFETS are cascade-coupled between a first end and a second end of the second p-ladder, and the second end of the second p-ladder is coupled to the first terminal of the fifth resistor and the second input of the second differential amplifier.

15. A digital-to-analog converter system comprising:
a gate driver including a first input, a second input, and multiple outputs;
a control circuit including a input and an output, the output of the control circuit coupled to the first input of the gate driver;
an R2R resistor ladder including multiple arms coupled together, at least some of the arms respectively including a p-channel field-effect transistor (PFET switch) and an n-channel field-effect transistor (NFET switch), in which a source of the NFET switch is coupled to a source of the PFET switch and a gate of the NFET switch is coupled to a different one of the outputs of the gate driver than the gates of the NFET switches of the other arms; and
a voltage regulator including:
a first resistor having a first terminal, a second terminal, and resistance R1;
N ladder PFETS, each ladder PFET having a source, a drain, and a gate, in which N is an integer greater than or equal to one, wherein if N is greater than one the ladder PFETS are coupled together as a p-ladder, so that the gates of the ladder PFETS are coupled together, the drains and sources of the ladder PFETS are cascade-coupled between a first end and a second end of the p-ladder, and the second end of the p-ladder is coupled to the first terminal of the first resistor;
a differential amplifier including a first input, a second input, and an output, the output of the differential amplifier coupled to the second input of the gate driver;
a second resistor having a first terminal, a second terminal, and resistance y×R1, in which y is an integer greater than one, and a first terminal of the second resistor is coupled to the second terminal of the first resistor and the first input of the differential amplifier; and
y×N ladder NFETS coupled together as an n-ladder, each ladder NFET having a source, a drain, and a gate, the gates of the ladder NFETS coupled together, the drains and sources of the ladder NFETS cascade-coupled between a first end and a second end of the n-ladder, the first end of the n-ladder coupled to the second terminal of the second resistor, and the second end of the n-ladder coupled to the output of the differential amplifier.

16. The digital-to-analog converter system of claim 15, further comprising:
a third resistor having a first terminal, a second terminal, and resistance R2; and
a fourth resistor having a first terminal, a second terminal, and resistance y×R2, the first terminal of the fourth resistor coupled to the second terminal of the third resistor and to the second input of the differential amplifier.

17. The digital-to-analog converter system of claim 15,
further comprising y×N−1 third resistors, each of the third resistors having a resistance R2;
wherein different pairs of the ladder NFETS that are adjacently coupled drain-to-source within the n-ladder have respective gates coupled together via different ones of the third resistors.

18. The digital-to-analog converter system of claim 17,
wherein each of the third resistors has a first terminal and a second terminal;
further comprising a current source having a first terminal and a second terminal, the second terminal of the current source coupled to the gate of the ladder NFET at the first end of the n-ladder and coupled to the first terminal of one of the third resistors.

19. The digital-to-analog converter system of claim 18,
wherein each of the ladder NFETS, when activated, is configured to have a drain-source voltage $V_{DS}$; and
wherein the current source is configured to provide a current equal to $V_{DS}$ divided by R2.

20. The digital-to-analog converter system of claim 18, wherein the ladder PFETS are first PFETS, the p-ladder is a first p-ladder, the differential amplifier is a first differential amplifier, and the current source includes:
- a second differential amplifier including a first input, a second input, and an output;
- a second PFET having a source, a drain, and a gate, the gate of the second PFET coupled to the output of the second differential amplifier, and the drain of the second PFET coupled to the second terminal of the current source;
- a fourth resistor having a first terminal, a second terminal, and resistance N×R2, the first terminal of the fourth resistor coupled to the first input of the second differential amplifier and the source of the second PFET;
- a fifth resistor having a first terminal and a second terminal; and
- N third PFETS, each of which includes a source, a drain, and a gate, wherein if N is greater than one the third PFETS are coupled together as a second p-ladder, so that the gates of the third PFETS are coupled together, the drains and sources of the third PFETS are cascade-coupled between a first end and a second end of the second p-ladder, and the second end of the second p-ladder is coupled to the first terminal of the fifth resistor and the second input of the second differential amplifier.

* * * * *